United States Patent [19]

Archer

[11] Patent Number: 5,200,654
[45] Date of Patent: Apr. 6, 1993

[54] TRIM CORRECTION CIRCUIT WITH TEMPERATURE COEFFICIENT COMPENSATION

[75] Inventor: Donald Archer, Sunnyvale, Calif.

[73] Assignee: National Semiconductor Corporation, Santa Clara, Calif.

[21] Appl. No.: 794,960

[22] Filed: Nov. 20, 1991

[51] Int. Cl.$^5$ .......................... G06G 7/10; H03F 3/45
[52] U.S. Cl. ................................... 307/491; 307/310; 330/256
[58] Field of Search .................... 307/310, 491, 296.1, 307/494; 330/253, 256, 9, 289

[56] References Cited

U.S. PATENT DOCUMENTS

| | | | |
|---|---|---|---|
| 4,618,833 | 10/1986 | Russell | 330/255 |
| 4,734,594 | 3/1988 | Nelson | 307/309 |
| 4,853,647 | 8/1989 | Low et al. | 330/256 |
| 5,045,806 | 9/1991 | Yan | 330/253 |

OTHER PUBLICATIONS

E. O. Johnson, The Insulated-Gate Field Effect Transistor-A Bipolar Transistor in Disguise RCA Review, vol. 34, Mar. 1973; pp. 80-95.
James R. Butler et al., AM Improved Performance MOS/BIPOLAR OP-AMP; IEEE International Solid-State Circuits COnference; Feb. 14, 1974; p. 138.
Scott Wurcer; A 3Nv/√Hz, DC Precise, JEFT Operational Amplifier; Analog Devices Semiconductor; Otto H. Schede, Jr.; Advances in BIMOS Integrated Circuits; RCA Review vol. 39, Jun. 1978; pp. 250-277.
M. A. Polinsky et al.; CMOS-Bipolar Monolithic Integrated-Circuit Technology; RCA Solid State Division; Somerville, NJ 08876; pp. 229-231.
Yannis P. Tsividis; A CMOS Voltage Reference; IEEE Journal of Solid State Circuits, vol. SC-13, No. 6; Dec. 1978; pp. 774-778.
A. Paul Brokaw et al.; THPM 12.6; A Fast, High-Precision Laser-Trimmed FET Input Operational Amplifier; ISSCC 74./Feb. 14, 1974; pp. 142-143 & 244.
Ronald W. Russell et al.; THPM 12.5; Ion Implanted JFET-Bipolar Monolithic Analog Circuits; ISSCC 74/Feb. 14, 1974; pp. 140-141 & 243.
Eric Vittoz et al.; CMOS Analog Integrated Circuits Based on Weak Inversion Operation; IEEE Journal of Solid-State Circuits; vol. SC-12, No. 3, Jun. 1977; pp. 224-231.

Primary Examiner—William L. Sikes
Assistant Examiner—Toan Tran
Attorney, Agent, or Firm—Limbach & Limbach

[57] ABSTRACT

An op amp bias system that provides input offset voltage trim current with minimum offset thermal drift. The bias system includes a bias generator that provides bias current to the op amp and correction circuitry responsive to the bias current for providing an input offset trim current that compensates for offset drift error with changes in temperature.

7 Claims, 4 Drawing Sheets

TRIM CORRECTION CIRCUIT WITH TEMPERATURE COEFFICIENT COMPENSATION

BACKGROUND OF THE INVENTION

1. Field of the Invention

The present invention relates to operational amplifiers and, in particular, to a precision trimming circuit that provides trim current compensation with the necessary temperature coefficient to track changes in input offset voltage with variations in temperature.

2. Discussion of the Prior Art

An operational amplifier (op amp), a basic building block in analog integrated circuits, amplifies the difference between two different potentials. A basic op amp consists of a dc amplifier with a differential input and a single-ended output.

An ideal op amp has zero output voltage for zero input. In reality, however, because of the inherent lack of precision in matching the op amp's two differential input transistors, an op amp will always have some output voltage for no input. This voltage is called the offset voltage. Since the output offset voltage is independent of op amp gain, it can easily be related to the differential input signal levels by dividing the output offset voltage at zero input by the closed loop gain. The result is typically referred to as the "input offset voltage."

The magnitude of the input offset voltage can cause yield problems and can severely limit the applications in which the op amp can be used.

Input offset is not a serious problem in and of itself, since it can be cancelled by equal and opposite compensating signals. The problem with input offset is that it can change with temperature. This change in input offset voltage with temperature is called thermal drift. Thus, to maintain the performance of the op amp within specified criteria, the offset compensation mechanism must be correlated to thermal drift; that is, it must provide an offset cancellation signal that tracks the change in input offset voltage with variations in temperature.

The requirement for input offset compensation in bipolar op amp circuits is not so severe because it is possible to fabricate matching pairs of bipolar transistors with a relatively high level of precision. However, because of the well-known power consumption and speed benefits afforded by complementary metal-oxide semiconductor (CMOS) integrated circuits, this technology is becoming increasingly more popular for use in fabricating all types of circuits, including op amps. While CMOS op amps have relatively low input offset when operated in the sub-threshold region, input offset in these circuits when operated in or near the sub-threshold (weak inversion) or quasi sub-threshold (moderate inversion) region is dominated by the initial threshold voltage ($V_T$).

The conventional technique for compensating for input offset and thermal drift in op amps is to provide a resistive nulling network that modifies the current relationships for the input differential pair.

FIG. 1 shows an op amp circuit in which the input stage is a differential PMOS pair that works into a bipolar load. Compensation for input offset voltage is provided by null resistors that provide an offset current to the differential pair for improved offset matching. That is, a correction voltage is reflected into the source leads of the input differential pair to balance the differential pair current densities.

The problem with this approach is that, as temperature changes, the trim input offset compensation current does not track the offset. That is, as temperature varies, the trim current and the offset error change at different rates.

When the op amp is operated in the sub-threshold region, the unbalanced currents magnify the offset error. That is, while the offset adjustment corrects for unbalanced differential pair currents, it doesn't correct for threshold voltage differences in the input FETs. Therefore, input offset voltage changes with changes in temperature.

Butler and Lane, "An Improved Performance MOS/Bipolar Op-Amp", 1974 IEEE International Solid State Circuits Conference, p. 138, describe an operational amplifier circuit, shown in FIG. 2, that also utilizes trimming current injection to compensate for input offset voltage. In this circuit, the correction voltage is derived from the IR drop in a series string of diffused resistors in which the temperature coefficient of the current is arranged to approximate the negative of the resistor temperature coefficient. Fine nulling is accomplished utilizing resistors $R_9$ and $R_{10}$, which are suitably tapped to minimize the effect of the diffused resister and trimpot temperature coefficients. However, this approach suffers from the same problems as the FIG. 1 offset compensation scheme in that the trim current does not track changes in the offset voltage with changes in temperature.

Thus, it would be highly desirable to have available a compensation circuit that can provide null input offset, but is not susceptible to thermal drift.

FIG. 3 shows a circuit described by Allen and Holberg, *CMOS Analog Circuit Design*, p. 248 for obtaining a negative temperature coefficient. The FIG. 3 threshold reference circuit balances threshold reference device Q1 against resistor R to provide a supply-independent reference current utilizable for setting up the bias of an op amp. However, this circuit has a strong negative temperature dependence.

Because the transconductance of MOSFETs decreases greatly at high temperature, a bias generator circuit that provides a positive temperature coefficient will offer more constant performance over a broad temperature range. The present invention optimizes op amp performance by using a positive temperature coefficient bias generator and a negative temperature coefficient offset trim current to maintain minimum offset drift with temperature.

SUMMARY OF THE INVENTION

The present invention provides an op amp bias system that provides input offset voltage trim current with minimum offset thermal drift. The bias system includes a bias generator that provides bias current to the op amp. Correction circuitry responsive to the bias current provides an input offset trim current that compensates for offset drift with change in temperature.

In an embodiment of the invention, the correction circuitry includes an input current mirror responsive to the bias current for reflecting a reference voltage to a resistive means to provide a temperature coefficient conversion current having a selectable temperature coefficient; a second current mirror means responsive to the bias current for providing an adjustable temperature coefficient correction current; and a current summing means for summing the temperature coefficient conversion current and the adjustable temperature coefficient correction current to provide an output current having a selected temperature coefficient.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
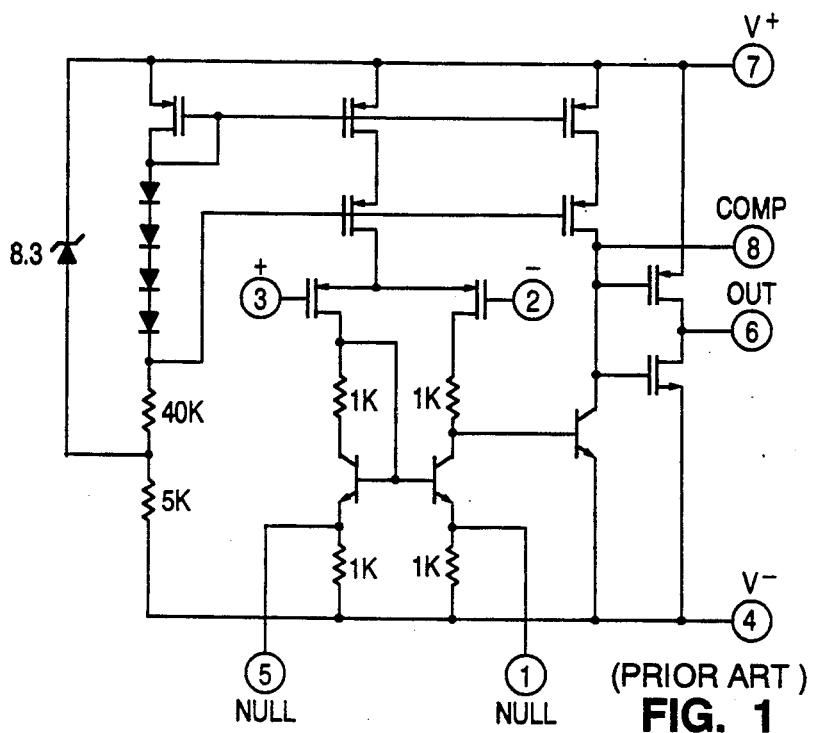
FIG. 1 is a schematic diagram illustrating a conventional trim current adjustment technique for compensating for input offset voltage in an operational amplifier.
Figure 2:
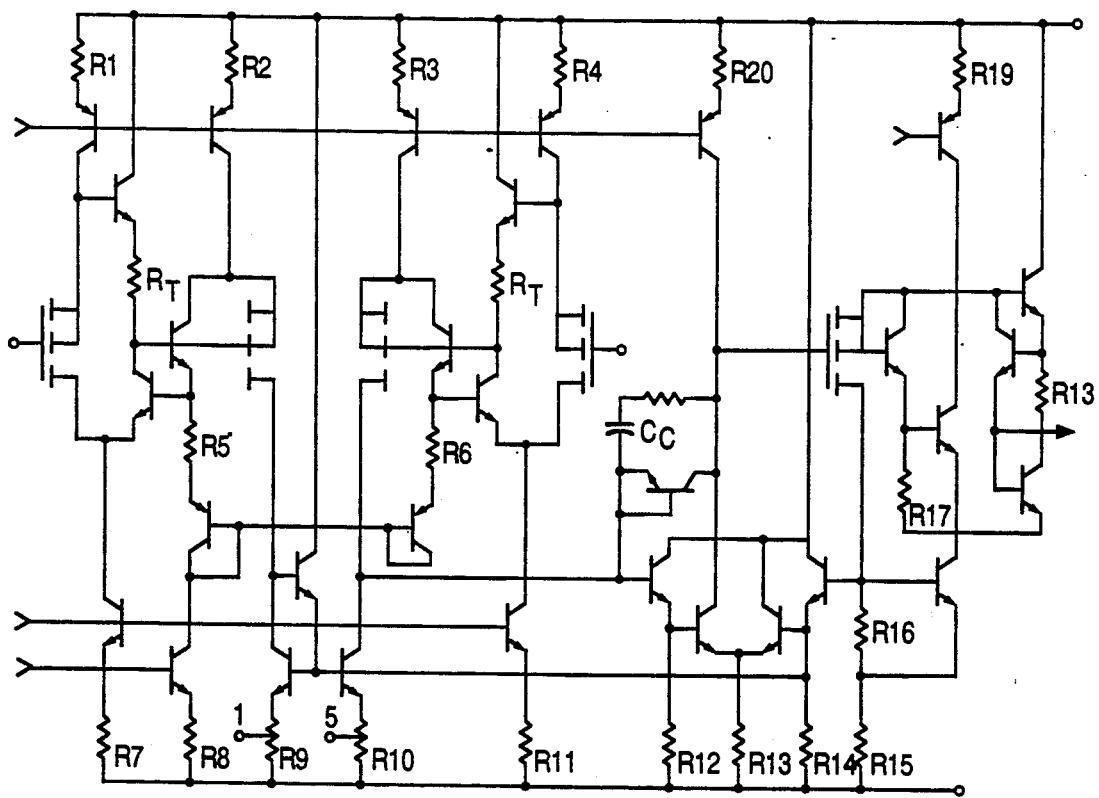
FIG. 2 is a schematic diagram illustrating another conventional technique for providing trim current to compensate for input offset voltage.
Figure 3:
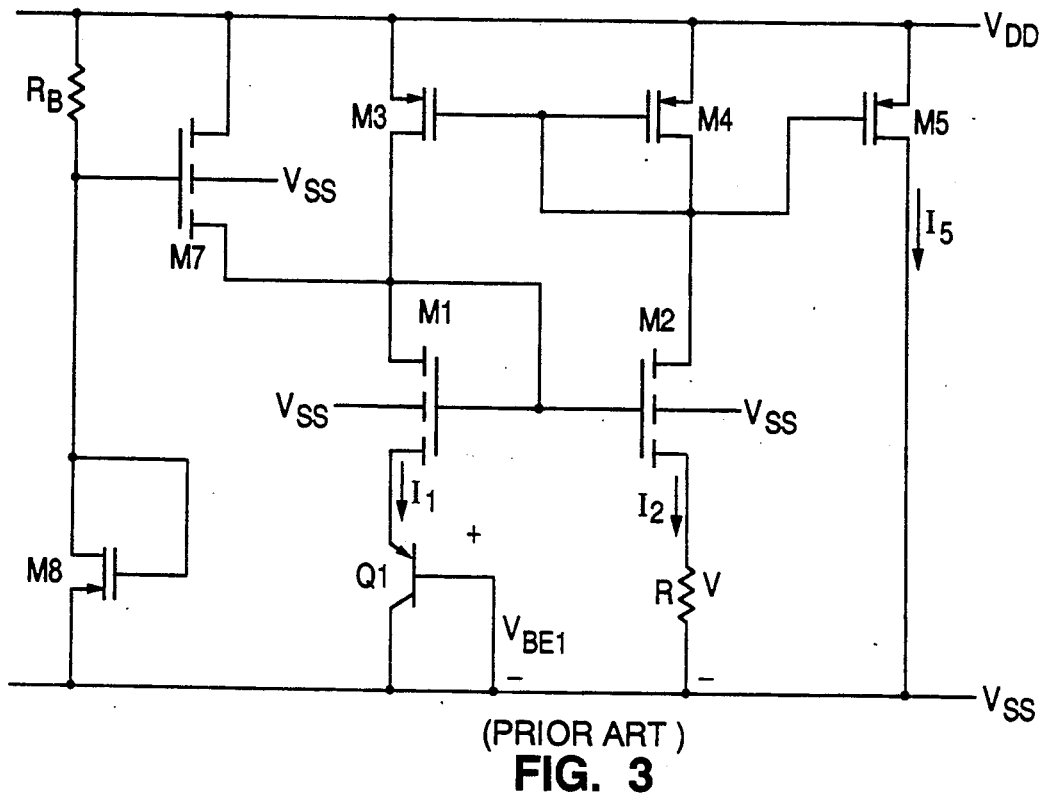
FIG. 3 is a schematic diagram illustrating a circuit for generating a bias current for an op amp that has a strong negative temperature coefficient.
Figure 4:
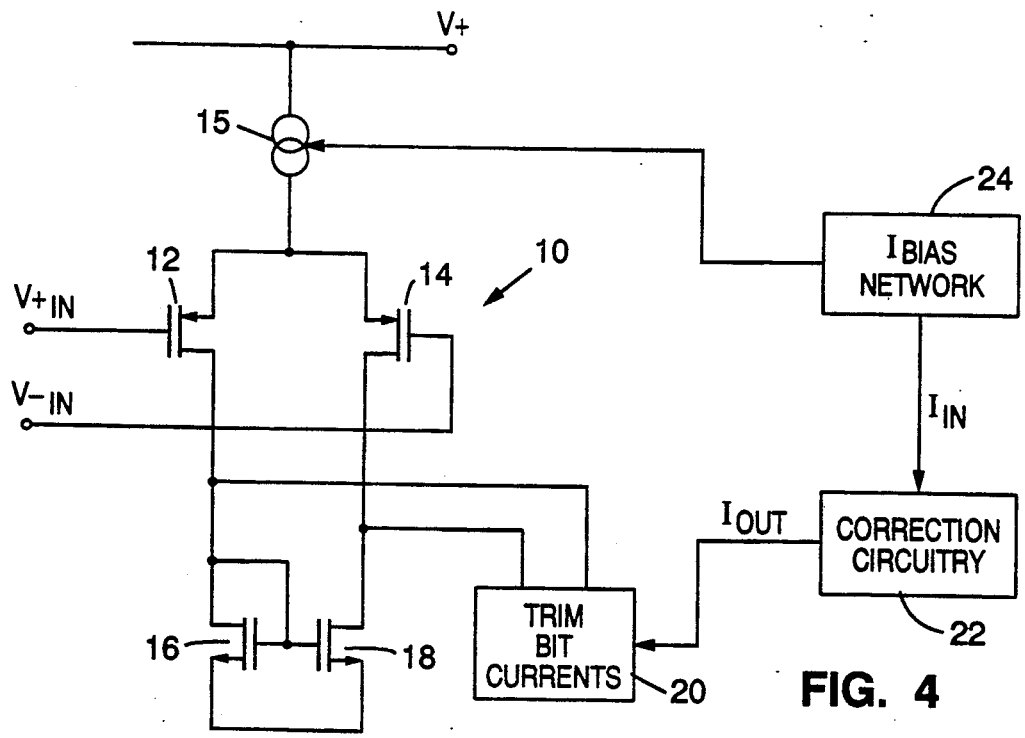
FIG. 4 is a block diagram illustrating an operational amplifier system that includes correction circuitry for compensating for input offset voltage in accordance with the present invention.

FIG. 4 shows an operational amplifier 10 that includes a p-channel input differential pair 12 and 14 for receiving differential input signals $V+_{in}$ and $V-_{in}$, respectively. Op amp 10 also includes a current mirror comprising n-channel transistors 16 and 18 connected in the conventional manner. A current source 15 is connected between the commonly-connected source electrodes of the differential pair 12, 14 and the positive supply $V+$.

Trim current bits 20, which may be of conventional current mirror design, are connected to inject trim current to null the input offset voltage of the input differential pair 12, 14.

In accordance with the present invention, temperature coefficient correction circuitry 22 provides trim compensation current with the necessary temperature coefficient to track input offset voltage with changes in temperature.

Trim current correction circuitry 22 and current source 15 are driven by a conventional current bias network 24, which can have a positive temperature coefficient.

Figure 5:
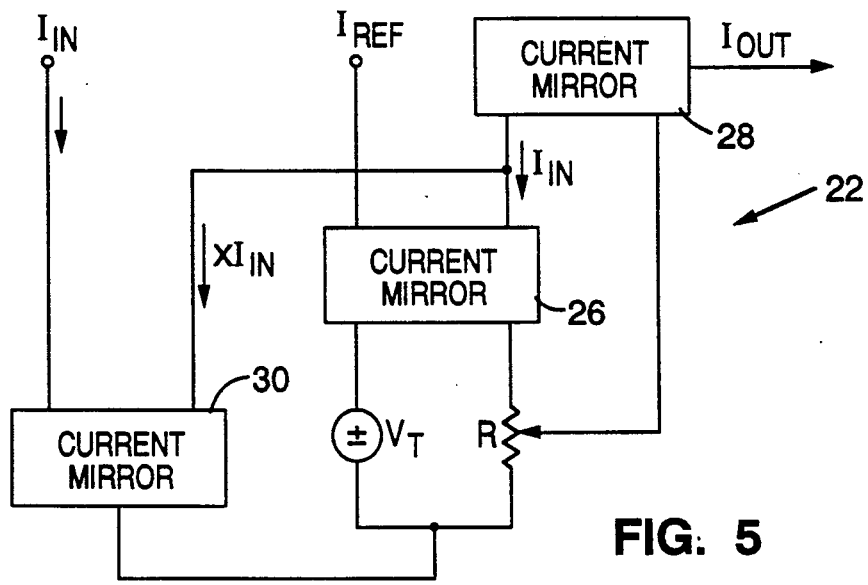
FIG. 5 is a block diagram illustrating a circuit for providing temperature compensated trimming currents in accordance with the present invention.

FIG. 5 shows a functional block diagram of the temperature coefficient correction circuitry 22. Current mirror 26 provides an output current Iin' proportional to voltage reference $V_T$. This output current is mirrored by current mirror 26 to active resistor R. Active resistor R is controlled by feedback current provided by a second current mirror 28. This feedback current results from the addition of a compensation current xIin to the current Iin'. Compensation current xIin is ratioed to current Iin with the same temperature coefficient as the input current Iin (which in this case is positive) by a third current mirror 30. The second current mirror 28 provides the temperature compensated output current Iout to the trim bit currents 20 (see FIG. 4).

Figure 6:
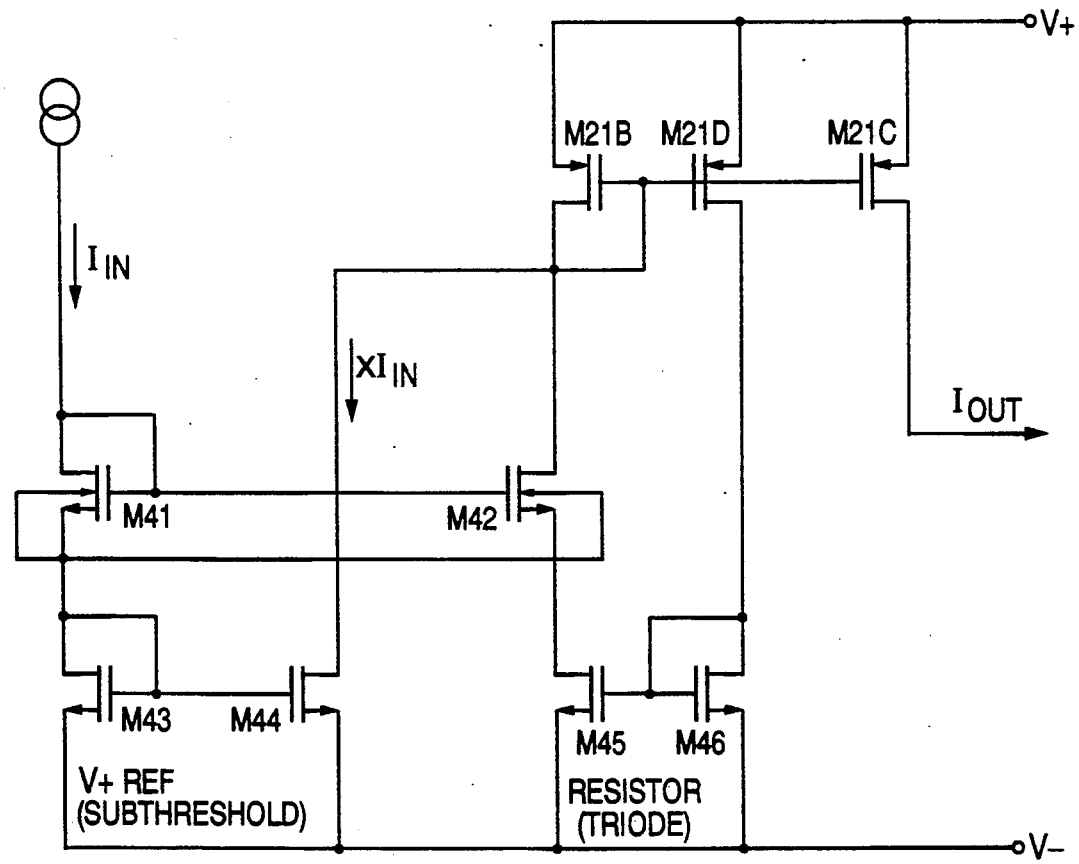
FIG. 6 is a schematic diagram illustrating an embodiment of a circuit for providing temperature compensated trimming current in accordance with the present invention.

FIG. 6 shows compensation circuitry for providing temperature compensated trimming currents to a CMOS operational amplifier to compensate for input offset voltage. The FIG. 6 circuit provides trim current with the necessary temperature coefficient to track input offset voltage thermal drift when driven by a current that has a more positive temperature coefficient than output current Iout.

The FIG. 6 circuit includes a conventional current mirror that includes N-channel mirror transistors M41 and M42. An N-channel diode-connected threshold voltage reference transistor M43, which is operable in the sub-threshold range, is connected between the source of mirror transistor M41 and the negative power supply. N-channel transistor M45, which operates in the triode mode, is connected between mirror transistor M42 and the negative supply. Thus, transistor M45 operates as an active resistor.

A second current mirror includes a first P-channel mirror transistor M21B, which serves as an input device, and a second P-channel mirror transistor M21C, which serves as the output device for the compensation circuit thus setting the current for the op amp's trim bits 20. As will be described in greater detail below, P-channel transistor M21D also mirrors the current of transistor M21B to provide feedback current to transistor M45. The second P-channel mirror transistor M21C has its source connected to the positive supply, its gate connected to the gate of the first P-channel transistor M21B and its drain connected to provide current to the trim currents injected into the operational amplifier's p-channel input differential pair loads.

An N-channel temperature coefficient correction transistor M44 is connected between the first P-channel mirror transistor M21B and the negative supply. Transistor M44 adds correction current for the necessary temperature coefficient. That is, the gate of transistor M44 is connected to the gate of the threshold voltage reference transistor M43 to provide a current Iin with the same temperature coefficient as the input current Iin, but which is scaled by area ratios. A curvature correction network includes a P-channel curvature correction transistor M21D that has its source connected to the positive supply and its gate connected to the commonly-connected gates of the first and second P-channel mirror transistors M21B and M21C. The drain of transistor M21D supplies current to transistor M46 to provide a gate voltage drive for transistor M45.

Threshold voltage reference transistor M43 is constructed to have an area such that it operates in the sub-threshold region, thus providing a reference voltage, with negative temperature coefficient, for N-channel mirror transistor M41. As stated above, transistor M45 operates in the triode region. Thus, if an appropriate voltage with the necessary temperature coefficient is applied to the gate of transistor M45, it serves as an excellent temperature independent resistor.

The input current Iin is reflected through current mirror M41, M42. That is, the drain current Iin of mirror transistor M41 equals the drain current of mirror transistor M42 at nominal reference temperature (+25° C.). This provides a very strong negative temperature coefficient. Since this value is excessive for correction of trim current, temperature coefficient modification is necessary.

Temperature coefficient modification is accomplished by adding a current mirror that includes P-channel transistor M21B and N-channel transistor M44 by setting the area value of transistor M44 with its gate tied to the threshold voltage reference transistor M43 to provide the current desired to be added to the current from transistor M42. The output current Iout is then reflected through the current mirror M21B, M21C to the trim circuit current mirror bits 20 of the operational amplifier's input differential pair, as shown in FIG. 4.

However, the above-described mechanism relies on compensated voltage applied to the gate of the triode-operated transistor M45, the resistance of transistor M45 being proportional to its transconductance. Knowing the voltage across transistor M45, the size of the transistor M45 can be calculated for a given current requirement.

To maintain compensating voltage at the gate of transistor M45, another current mirror transistor M21D is provided. With the areas of transistors M45 and M46 chosen to be appropriately ratioed, a constant resistance is provided in transistor M45.

Transistor M44 also acts as a start-up circuit for transistor M46. With transistor M44 selected, current is balanced between transistors M41 and M42 at the nominal reference temperature.

The above-described circuit provides the advantage of being manufacturable in the same IC technology; no attempt must be made to match different technologies. It also tracks process values. It is also a very compact circuit that requires no high value resistors.

Figure 7:
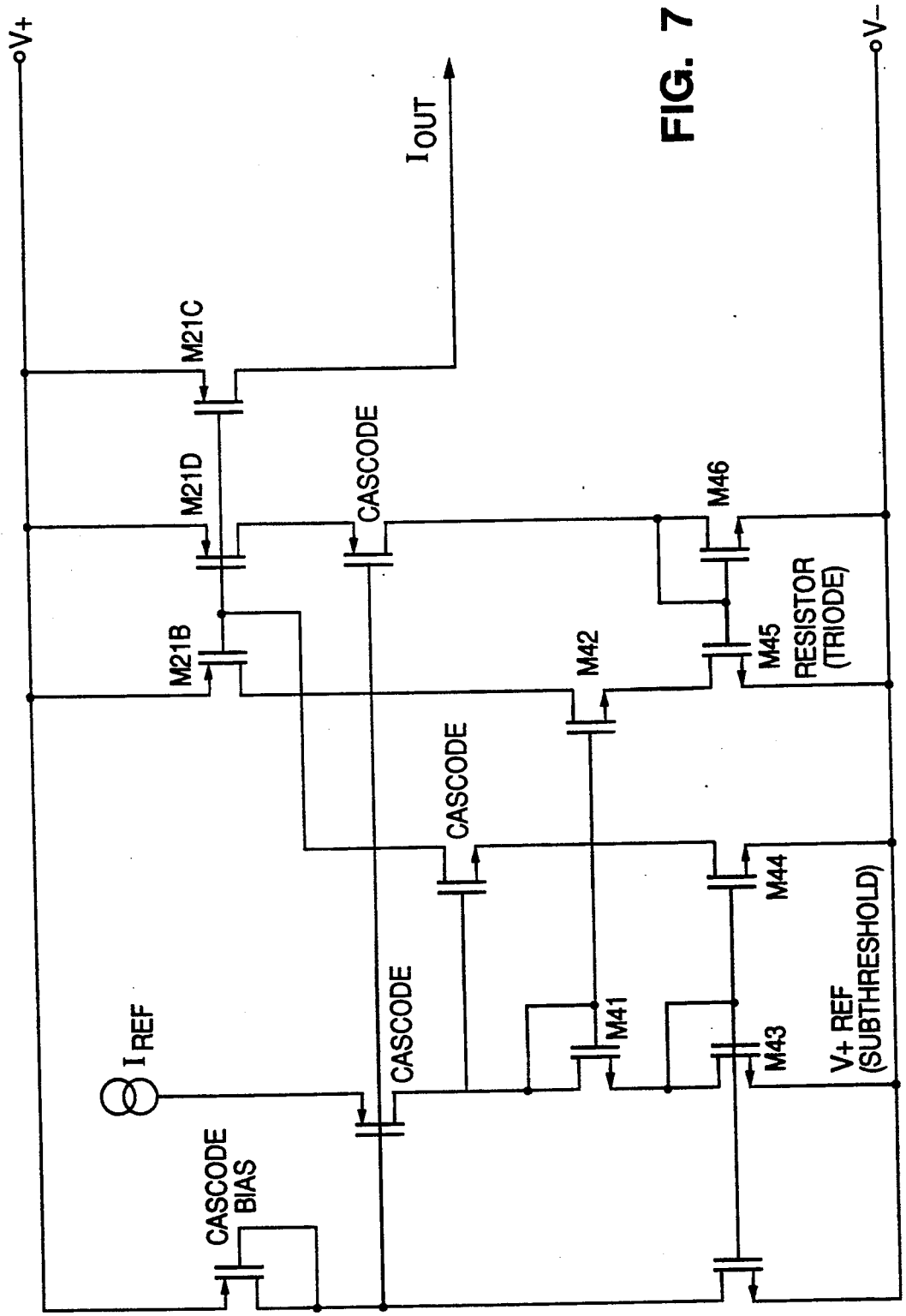
FIG. 7 is a schematic diagram illustrating cascode devices added to the FIG. 6 circuit to compensate for the effects of Early voltage.

Since Early voltage in the FIG. 6 embodiment of the invention may cause changes in trim current with changes in supply voltage, cascode devices are added in the FIG. 7 embodiment to address this problem.

It should be understood that various alternatives to the embodiments of the invention described herein may be employed in practicing the invention. For example, those skilled in the art will appreciate that the above-described concepts could be implemented by substituting n-channel devices for the p-channel devices in the FIG. 6 and FIG. 7 circuits and p-channel devices for n-channel devices. Also, the op amp's p-channel input differential pair could be replaced by an n-channel differential pair. It is intended that the following claims define the scope of the invention and that methods and circuitry within the scope of these claims and their equivalents be covered thereby.

What is claimed is:

1. An operational amplifier bias system that provides input offset voltage trim current to an operational amplifier with minimum offset thermal drift, the bias system comprising:
    a bias generator that provides bias generator current to the operational amplifier; and
    correction means responsive to the bias generator current for providing an input offset trim current to the operational amplifier that compensates for offset drift error of the input offset voltage of the operational amplifier with change in temperature, the correction means including a resistive element, an input current mirror responsive to the bias generator current for providing a reference current to the resistive element to provide a temperature coefficient conversion current having a predetermined temperature coefficient, a second current mirror responsive to the bias generator current for providing a temperature coefficient correction current, current summing means for summing the temperature coefficient conversion current and the temperature coefficient conversion current to provide an output current having a predetermined temperature coefficient, and a trim bit network responsive to the output current for providing the input offset voltage trim current.

2. A method of providing input offset voltage trim current to an operational amplifier, the method comprising:
    providing a bias support to the operational amplifier;
    utilizing the bias current to reflect a reference voltage to a resistive element to provide a temperature coefficient conversion current having a predetermined temperature coefficient;
    utilizing the bias current to provide a temperature coefficient correction current;
    summing the temperature coefficient correction current and the temperature coefficient correction current to provide an output current having a predetermined temperature coefficient; and
    utilizing the output current to generate the input offset voltage trim current.

3. An op amp bias system as in claim 1 wherein the resistive element comprises a linear resistive element.

4. An op amp bias system as in claim 1 and further comprising feedback means for linearizing the resistive element.

5. An op amp bias system as in claim 1 wherein the resistive element comprises an active resistor.

6. An op amp bias system as in claim 5 wherein the active resistor comprises a MOSFET device biased for operation in the triode region.

7. An operational amplifier bias circuit for providing temperature compensated trim current to a CMOS operational amplifier to compensate for input offset voltage, the circuit comprising:
    (a) a first current mirror that includes a first diode-connected N-channel mirror transistor and a second N-channel mirror transistor, the gate of the first mirror transistor being connected to the gate of the second mirror transistor, the body of the second mirror transistor being connected to the body and to the source of the first mirror transistor;
    (b) a diode-connected N-channel threshold voltage reference transistor operable in the sub-threshold range and having its drain connected to the source of the first mirror transistor and its source connected to a negative supply;
    (c) an N-channel resistive transistor operable in the triode mode, and having its drain connected to the source of the second mirror transistor and its source connected to the negative supply;
    (d) a second current mirror that includes a first diode-connected P-channel mirror transistor having its source connected to a positive supply and its drain connected to the drain of the second N-channel mirror transistor, and a second P-channel mirror transistor having its source connected to the positive power supply, its gate connected to the gate of the first P-channel transistor and its drain connected to provide compensation current to a load of the operational amplifier's input differential pair;
    (e) an N-channel temperature coefficient correction transistor having its drain connected to the drain of the first P-channel mirror transistor, its source connected to the negative supply and its gate connected to the gate of the threshold voltage reference transistor; and (f) a curvature correction network that includes a P-channel curvature correction transistor having its source connected to the positive supply and its gate connected to the commonly-connected gates of the first and second P-channel mirror transistors and a N-channel curvature correction transistor having its source connected to the negative supply, its drain connected to the drain of the P-channel curvature correction transistor, and its gate connected both to its drain and to the gate of the N-channel resistive transistor.

* * * * *

UNITED STATES PATENT AND TRADEMARK OFFICE
CERTIFICATE OF CORRECTION

PATENT NO. : 5,200,654

DATED : April 6, 1993

INVENTOR(S): Don Archer

It is certified that error appears in the above - identified patent and that said Letters Patent is hereby corrected as shown below:

Column 6, line 21, after "coefficient" delete

"correction" and replace with --conversion--.

Signed and Sealed this

Eighteenth Day of January, 1994

Attest:

BRUCE LEHMAN

Attesting Officer

Commissioner of Patents and Trademarks